(12) United States Patent
Toi et al.

(10) Patent No.: US 8,176,451 B2
(45) Date of Patent: May 8, 2012

(54) BEHAVIORAL SYNTHESIS APPARATUS, BEHAVIORAL SYNTHESIS METHOD, AND COMPUTER READABLE RECORDING MEDIUM

(75) Inventors: Takao Toi, Tokyo (JP); Noritsugu Nakamura, Tokyo (JP); Yoshinosuke Kato, Tokyo (JP); Toru Awashima, Tokyo (JP); Taro Fujii, Kanagawa (JP); Toshiro Kitaoka, Kanagawa (JP); Koichiro Furuta, Kanagawa (JP); Masato Motomura, Kanagawa (JP)

(73) Assignees: NEC Corporation, Tokyo (JP); Renesas Electronics Corporation, Kanagawa (JP)

( * ) Notice: Subject to any disclaimer, the term of this patent is extended or adjusted under 35 U.S.C. 154(b) by 305 days.

(21) Appl. No.: 12/569,043

(22) Filed: Sep. 29, 2009

(65) Prior Publication Data

US 2010/0083209 A1    Apr. 1, 2010

(30) Foreign Application Priority Data

Sep. 30, 2008   (JP) ................................. 2008-255207

(51) Int. Cl.
*G06F 17/50*    (2006.01)

(52) U.S. Cl. ........ 716/104; 716/103; 716/122; 716/123; 716/129; 716/130; 716/132; 703/16

(58) Field of Classification Search .................. 716/103, 716/104, 122, 123, 129, 130, 132; 703/16
See application file for complete search history.

(56) References Cited

U.S. PATENT DOCUMENTS

| 6,226,776 B1 * | 5/2001 | Panchul et al. ............... 716/102 |
| 6,848,085 B2 * | 1/2005 | Panchul et al. ............... 716/102 |
| 2001/0034876 A1 * | 10/2001 | Panchul et al. ............... 716/18 |

FOREIGN PATENT DOCUMENTS

JP          2003-99409 A    4/2003

* cited by examiner

*Primary Examiner* — Phallaka Kik
(74) *Attorney, Agent, or Firm* — Scully, Scott, Murphy & Presser, PC

(57) ABSTRACT

A behavioral synthesis apparatus includes a acquisition unit, a scheduling unit and a generation unit. The acquisition unit acquires a behavioral level description describing an operation of a semiconductor integrated circuit. The scheduling unit separates the acquired behavioral level description into N stage descriptions, and makes a schedule in such a way that input/output operations and computations among the N stage descriptions are pipelined. The generation unit generates a register transfer level description based on the N stage descriptions and a result of scheduling performed by the scheduling unit in such a way as to form stage circuits respectively corresponding to the N stage descriptions and a state control circuit which controls possible 2N−1 stage control states of the semiconductor integrated circuit. The generation unit generates the register transfer level description in such a way as to inhibit the operation of a stage circuit which need not be operated.

7 Claims, 12 Drawing Sheets

FIG.8

| STATE TRANSITIONS | STAGE CONTROL STATES | FIRST STAGE | SECOND STAGE | THIRD STAGE | FOURTH STAGE | STAGE CIRCUIT |
|---|---|---|---|---|---|---|
| 1 | 1 | ☐ | | | | |
| 2 | 2 | ☐ | ☐ | | | |
| 3 | 3 | ☐ | ☐ | ☐ | | |
| 4 | 4 | ☐ | ☐ | ☐ | ☐ | |
| 5 | 5 | | ☐ | ☐ | ☐ | |
| 6 | 6 | | | ☐ | ☐ | |
| 7 | 7 | | | | ☐ | |

FIG.11

| STATE TRANSITIONS | STAGE CONTROL STATES | CONTEXTS | FIRST STAGE | SECOND STAGE | THIRD STAGE | FOURTH STAGE | STAGE CIRCUIT |
|---|---|---|---|---|---|---|---|
| 1 | 1 | 1 | ☐ | | | | |
| 2 | 1 | 2 | ☐ | | | | |
| 3 | 2 | 1 | ☐ | ☐ | | | |
| 4 | 2 | 2 | ☐ | ☐ | | | |
| 5 | 3 | 1 | ☐ | ☐ | ☐ | | |
| 6 | 3 | 2 | ☐ | ☐ | ☐ | | |
| 7 | 4 | 1 | ☐ | ☐ | ☐ | ☐ | |
| 8 | 4 | 2 | ☐ | ☐ | ☐ | ☐ | |
| 9 | 5 | 1 | | ☐ | ☐ | ☐ | |
| 10 | 5 | 2 | | ☐ | ☐ | ☐ | |
| 11 | 6 | 1 | | | ☐ | ☐ | |
| 12 | 6 | 2 | | | ☐ | ☐ | |
| 13 | 7 | 1 | | | | ☐ | |
| 14 | 7 | 2 | | | | ☐ | |

BEHAVIORAL SYNTHESIS APPARATUS, BEHAVIORAL SYNTHESIS METHOD, AND COMPUTER READABLE RECORDING MEDIUM

INCORPORATION BY REFERENCE

This application is based on Japanese Patent Application No. 2008-255207 filed on Sep. 30, 2008 and including specification, claims, drawings and summary. The disclosure of the above Japanese Patent Application is incorporated herein by reference in its entirety.

TECHNICAL FIELD

The present invention relates to a behavioral synthesis apparatus and behavioral synthesis method, which are suitable for generating a register transfer level description to achieve a fast pipelined circuit, and a computer readable recording medium recording a program suitable for generating such a register transfer level description.

BACKGROUND ART

Recently, a DRP (Dynamically Reconfigurable Processor) is attracting attention as an array type processor capable of easily changing a circuit behavior while achieving the performance of a dedicated logic circuit.

With the advancement of the computer technology, design, analysis, evaluation, etc. of electronic circuits realized by using a DRP are typically carried out using a CAD (Computer-Aided Design) system equipped with a behavioral synthesis tool and logic synthesis tool. For example, Unexamined Japanese Patent Application KOKAI Publication No. 2003-99409 discloses a behavioral synthesis apparatus which is adapted to such a CAD system.

The behavioral synthesis tool performs behavioral synthesis based on a behavioral level description containing information necessary for achieving a hardware configuration, such as input ports and the bit widths of variables, to output an RTL (Register Transfer Level) description.

More specifically, the behavioral synthesis tool performs syntax parsing on an behavioral level description written in a high-level language, such as System C, to generate a DFG (Data Flow Graph). The behavioral synthesis tool performs scheduling based on the generated DFG to generate a CDFG (Control Data Flow Graph). Then, the behavioral synthesis tool generates an RTL description which can be input directly to a logic synthesis tool.

Note that the behavioral synthesis tool can generate an RTL description realizing an electronic circuit which executes processes while changing over a plurality of contexts (operational states) from one to another. In this case, the behavioral synthesis tool executes behavioral synthesis in such a way that the electronic circuit includes an STC (State Transition Controller) which changes over contexts based on a clock signal or the like. There may be a single context in which case the STC changes over a plurality of processing stages (stage control states) in a single context.

To realize a fast computation circuit, a pipelined circuit is frequently used. The pipelined circuit includes a plurality of stage circuits to which different computation processes are assigned. The individual stage circuits receive data from the preceding stage circuits, perform computations in parallel at a mutually common number of clocks, and give the computation results to the subsequent stage circuits.

There are a lot of demands to achieve fast computation in realizing such a pipelined circuit with a reconfigurable semiconductor integrated circuit like a DRP.

SUMMARY

An exemplary object of the invention is to provide a behavioral synthesis apparatus, behavioral synthesis method and a computer readable recording medium, which are suitable for generating a register transfer level description to achieve a fast pipelined circuit.

To achieve the exemplary object, according to the invention, there is provided a behavioral synthesis apparatus including:

a acquisition unit that acquires a behavioral level description describing an operation of a semiconductor integrated circuit;

a scheduling unit that separates the acquired behavioral level description into N stage descriptions, and makes a schedule in such a way that input/output operations and computations among the N stage descriptions are pipelined; and a generation unit that generates a register transfer level description describing a configuration, layout and interconnection of the semiconductor integrated circuit based on the N stage descriptions and a result of scheduling performed by the scheduling unit in such a way as to form stage circuits respectively corresponding to the N stage descriptions and a state control circuit which controls possible 2N−1 stage control states of the semiconductor integrated circuit, the generation unit generating the register transfer level description in such a way that for each integer i=1, 2, . . . , N−1, an output of an ith stage circuit becomes an input to an (i+1)th stage circuit, the state control circuit updates the stage control states of the semiconductor integrated circuit in order from a first stage control state to an (N−1)th stage control state, then repeats an Nth stage control state L times, then updates the stage control states of the semiconductor integrated circuit in order from an (N+1)th stage control state to an (2N−1)th stage control state, and when a current stage control state is a jth stage control state, the state control circuit (a) operates the first to jth stage circuits and stops (j+1)th to Nth stage circuits when j is equal to or greater than 1 and less than N, (b) operates the first to Nth stage circuits when j is equal to N, and (c) stops the first to (j-N)th stage circuits and operates (j−N+1)th to Nth stage circuits when j is greater than N.

According to the invention, there is provided a behavioral synthesis apparatus comprising:

acquisition means that acquires a behavioral level description describing an operation of a semiconductor integrated circuit;

scheduling means that separates the acquired behavioral level description into N stage descriptions, and makes a schedule in such a way that input/output operations and computations among the N stage descriptions are pipelined; and generation means that generates a register transfer level description describing a configuration, layout and interconnection of the semiconductor integrated circuit based on the N stage descriptions and a result of scheduling performed by the scheduling means in such a way as to form stage circuits respectively corresponding to the N stage descriptions and a state control circuit which controls possible 2N−1 stage control states of the semiconductor integrated circuit, the generation means generating the register transfer level description in such a way that for each integer i=1, 2, . . . , N−1, an output of an ith stage circuit becomes an input to an (i+1)th stage circuit, the state control circuit updates the stage control states of the semiconductor integrated circuit in order from a first stage control state to an (N−1)th stage control state, then repeats an Nth stage control state L times, then updates the stage control states of the semiconductor integrated circuit in order from an (N+1)th stage control state to an (2N−1)th stage control state, and when a current stage control state is a jth stage control state, the state control circuit (a) operates first to jth stage circuits and stops (j+1)th to Nth stage circuits when j is equal to or greater than 1 and less than N, (b) operates the first to Nth stage circuits when j is equal to N, and (c) stops the first to (j−N)th stage circuits and operates (j−N+1)th to Nth stage circuits when j is greater than N.

According to the invention, there is provided a behavioral synthesis method to be executed by a behavioral synthesis apparatus having a acquisition unit, a scheduling unit and a generation unit, including:

an acquisition step of causing the acquisition unit to acquire a behavioral level description describing an operation of a semiconductor integrated circuit;

a scheduling step of causing the scheduling unit to separate the acquired behavioral level description into N stage descriptions, and make a schedule in such a way that input/output operations and computations among the N stage descriptions are pipelined; and a generation step of causing the generation unit to generate a register transfer level description describing a configuration, layout and interconnection of the semiconductor integrated circuit based on the N stage descriptions and a result of scheduling performed by the scheduling unit in such a way as to form stage circuits respectively corresponding to the N stage descriptions and a state control circuit which controls possible 2N−1 stage control states of the semiconductor integrated circuit, the generation unit generating the register transfer level description in such a way that for each integer i=1, 2, . . . , N−1, an output of an ith stage circuit becomes an input to an (i+1)th stage circuit, the state control circuit updates the stage control states of the semiconductor integrated circuit in order from a first stage control state to an (N−1)th stage control state, then repeats an Nth stage control state L times, then updates the stage control states of the semiconductor integrated circuit in order from an (N+1)th stage control state to an (2N−1)th stage control state, and when a current stage control state is a jth stage control state, the state control circuit (a) operates first to jth stage circuits and stops (j+1)th to Nth stage circuits when j is equal to or greater than 1 and less than N, (b) operates the first to Nth stage circuits when j is equal to N, and (c) stops the first to (j−N)th stage circuits and operates (j−N+1)th to Nth stage circuits when j is greater than N.

According to the invention, there is provided a computer readable recording medium recording a program allowing a computer to function as:

a acquisition unit that acquires a behavioral level description describing an operation of a semiconductor integrated circuit;

a scheduling unit that separates the acquired behavioral level description into N stage descriptions, and makes a schedule in such a way that input/output operations and computations among the N stage descriptions are pipelined; and a generation unit that generates a register transfer level description describing a configuration, layout and interconnection of the semiconductor integrated circuit based on the N stage descriptions and a result of scheduling performed by the scheduling unit in such a way as to form stage circuits respectively corresponding to the N stage descriptions and a state control circuit which controls possible 2N−1 stage control states of the semiconductor integrated circuit, the generation unit generating the register transfer level description in such a way that for each integer i=1, 2, . . . , N−1, an output of an ith stage circuit becomes an input to an (i+1)th stage circuit, the state control circuit updates the stage control states of the semiconductor integrated circuit in order from a first stage control state to an (N−1)th stage control state, then repeats an Nth stage control state L times, then updates the stage control states of the semiconductor integrated circuit in order from an (N+1)th stage control state to an (2N−1)th stage control state, and when a current stage control state is a jth stage control state, the state control circuit (a) operates first to jth stage circuits and stops (j+1)th to Nth stage circuits when j is equal to or greater than 1 and less than N, (b) operates the first to Nth stage circuits when j is equal to N, and (c) stops the first to (j−N)th stage circuits and operates (j−N+1)th to Nth stage circuits when j is greater than N.

BRIEF DESCRIPTION OF THE DRAWINGS

These objects and other objects and advantages of the present invention will become more apparent upon reading of the following description and the accompanying drawings in which:

FIG. 8 is a diagram schematically showing in what order the individual stage circuits become active when a pipelined circuit is configured by a single context;

FIG. 11 is a diagram schematically showing in what order the individual stage circuits become active when a pipelined circuit is configured by two contexts.

EXEMPLARY EMBODIMENTS

First Exemplary Embodiment

Figure 1:
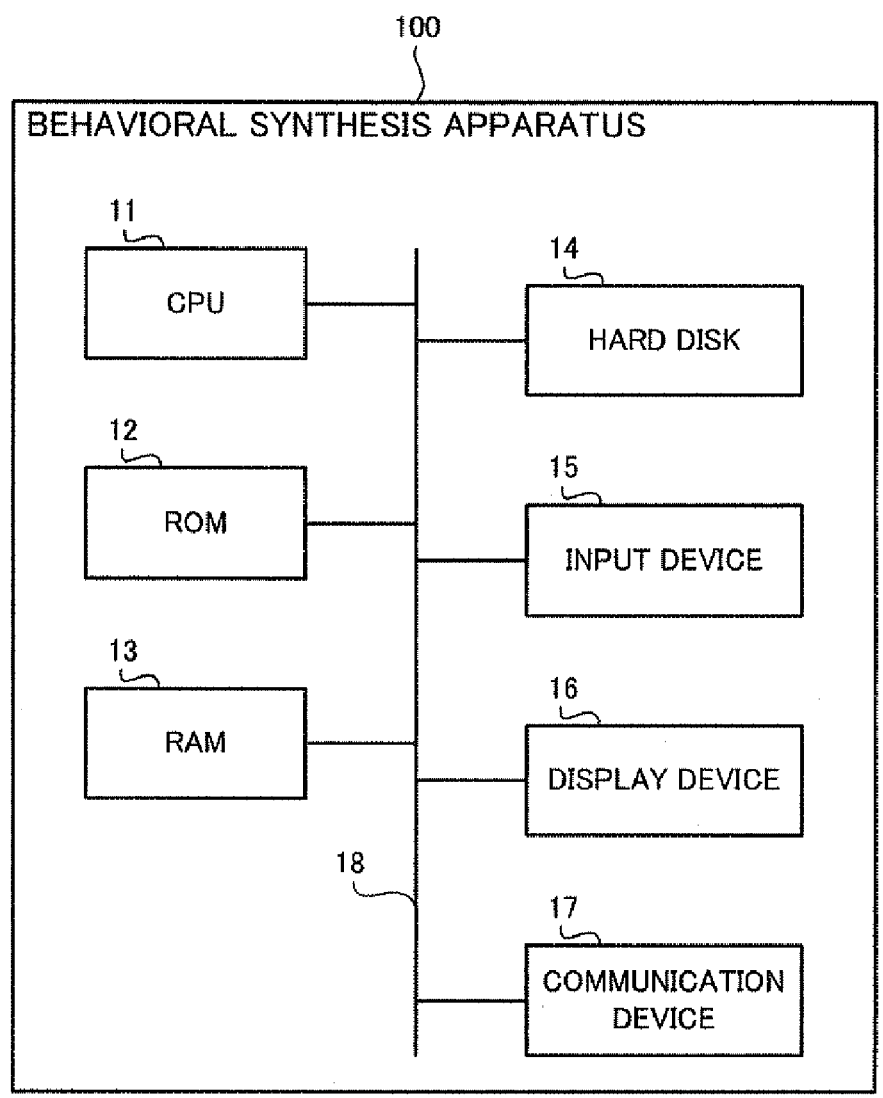
FIG. 1 is a block diagram showing the hardware configuration of behavioral synthesis apparatuses according to first and second exemplary embodiments.

A behavioral synthesis apparatus according to this exemplary embodiment will be described below with reference to the accompanying drawings. FIG. 1 is a block diagram showing the hardware configuration of a behavioral synthesis apparatus 100 according to the exemplary embodiment. The behavioral synthesis apparatus 100 performs behavioral synthesis on a behavioral level description describing information necessary for achieving the hardware configuration of a semiconductor integrated circuit, such as input ports and the bit widths of variables, to generate an RTL (Register Transfer Level) description.

As shown in FIG. 1, the behavioral synthesis apparatus 100 has a CPU (Central Processing Unit) 11, a ROM (Read Only Memory) 12, a RAM (Random Access Memory) 13, a hard disk 14, an input device 15, a display device 16, and a communication device 17. The individual components of the behavioral synthesis apparatus 100 are connected together by a bus 18.

The CPU 11 controls the general operation of the behavioral synthesis apparatus 100 according to a program stored in the hard disk 14. The CPU 11 exchanges control signals and data with the individual components by the bus 18.

The ROM 12 stores an IPL (Initial Program Loader) which is executed immediately after the behavioral synthesis apparatus 100 is powered on. After the IPL is executed, the CPU 11 reads a program stored in the hard disk 14 into the RAM 13, and runs the program.

The RAM 13 temporarily stores data and a program.

The hard disk 14 stores programs that are executed by the CPU 11. The hard disk 14 stores a behavioral level description of a behavioral synthesis target, an RTL description obtained by behavioral synthesis, constraint conditions at the time of executing behavioral synthesis, and so forth. The constraint conditions include a condition on the number of ports, and a constraint condition on a delay time.

The input device 15 receives designation of the behavioral level description of the behavioral synthesis target, a request to start behavioral synthesis, or the like from a user under the control of the CPU 11. The input device 15 is comprised of, for example, a keyboard or a mouse.

The display device 16 displays a screen for receiving designation of the behavioral level description of the behavioral synthesis target from the user, a screen for receiving the request to start behavioral synthesis from the user, a screen for providing the user with the behavioral level description, a screen for providing the user with an RTL description or the like under the control of the CPU 11. The display device 16 is comprised of, for example, a liquid crystal display device.

The communication device 17 communicates with an external information processing apparatus under the control of the CPU 11 to input a behavioral level description from the external information processing apparatus or output an RTL description to the external information processing apparatus. The communication device 17 is comprised of, for example, an NIC (Network Interface Card).

Figure 2:
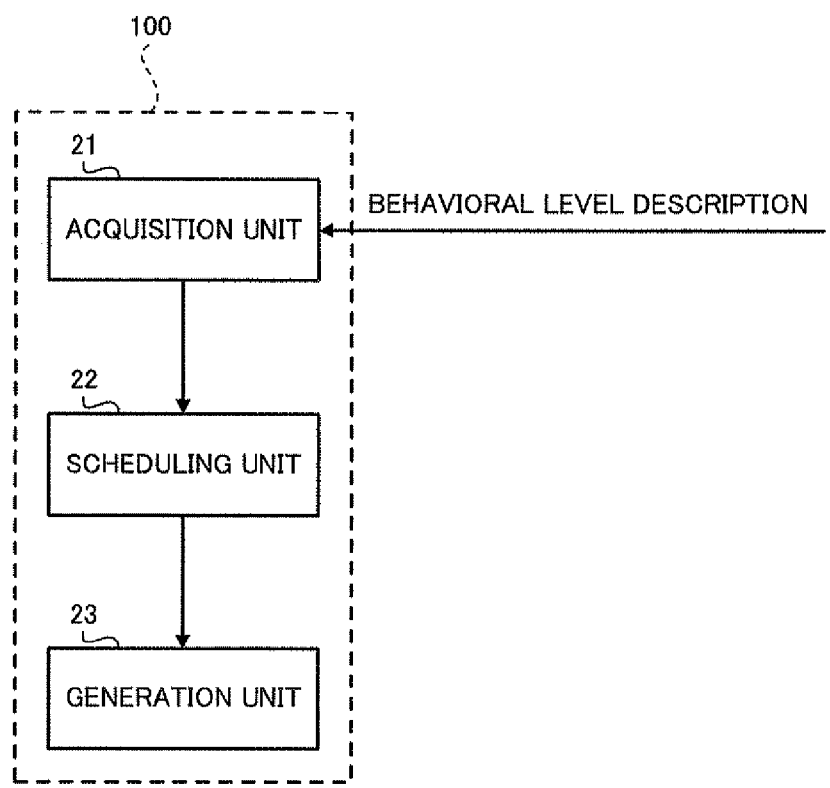
FIG. 2 is a block diagram showing the functional configuration of the behavioral synthesis apparatuses according to the first and second exemplary embodiments.

FIG. 2 is a block diagram showing the functional configuration of the behavioral synthesis apparatuses 100 according to the exemplary embodiment. As shown in FIG. 2, the behavioral synthesis apparatus 100 functionally includes a acquisition unit 21, a scheduling unit 22, and a generation unit 23.

The acquisition unit 21 acquires a behavioral level description describing the operation of a semiconductor integrated circuit.

The scheduling unit 22 separates the acquired behavioral level description into N stage descriptions, and makes a schedule in such a way that input/output operations, and computations among the N stage descriptions are pipelined.

The generation unit 23 generates an RTL description describing a configuration, layout and interconnection of the semiconductor integrated circuit based on the N stage descriptions and a result of scheduling performed by the scheduling unit 22 to form stage circuits respectively corresponding to the N stage descriptions and a state control circuit which controls possible 2N−1 stage control states of the semiconductor integrated circuit.

The generation unit 23 generates the RTL description to achieve the contents of the following three paragraphs (1) to (3).

(1) For each integer i=1, 2, . . . , N−1, an output of an ith stage circuit becomes an input to an (i+1)th stage circuit.

(2) The state control circuit updates the stage control states of the semiconductor integrated circuit in order from a first stage control state to an (N−1)th stage control state, then repeats an Nth stage control state L times, then updates the stage control states of the semiconductor integrated circuit in order from an (N+1)th stage control state to an (2N−1)th stage control state.

(3) When a current stage control state is a jth stage control state, the state control circuit operates in the following manners (a) to (c).

(a) The state control circuit operates first to jth stage circuits and stops (j+1)th to Nth stage circuits when j is equal to or greater than 1 and less than N.

(b) The state control circuit operates the first to Nth stage circuits when j is equal to N.

(c) The state control circuit stops the first to (j−N)th stage circuits and operates (j−N+1)th to Nth stage circuits when j is greater than N.

Figure 3:
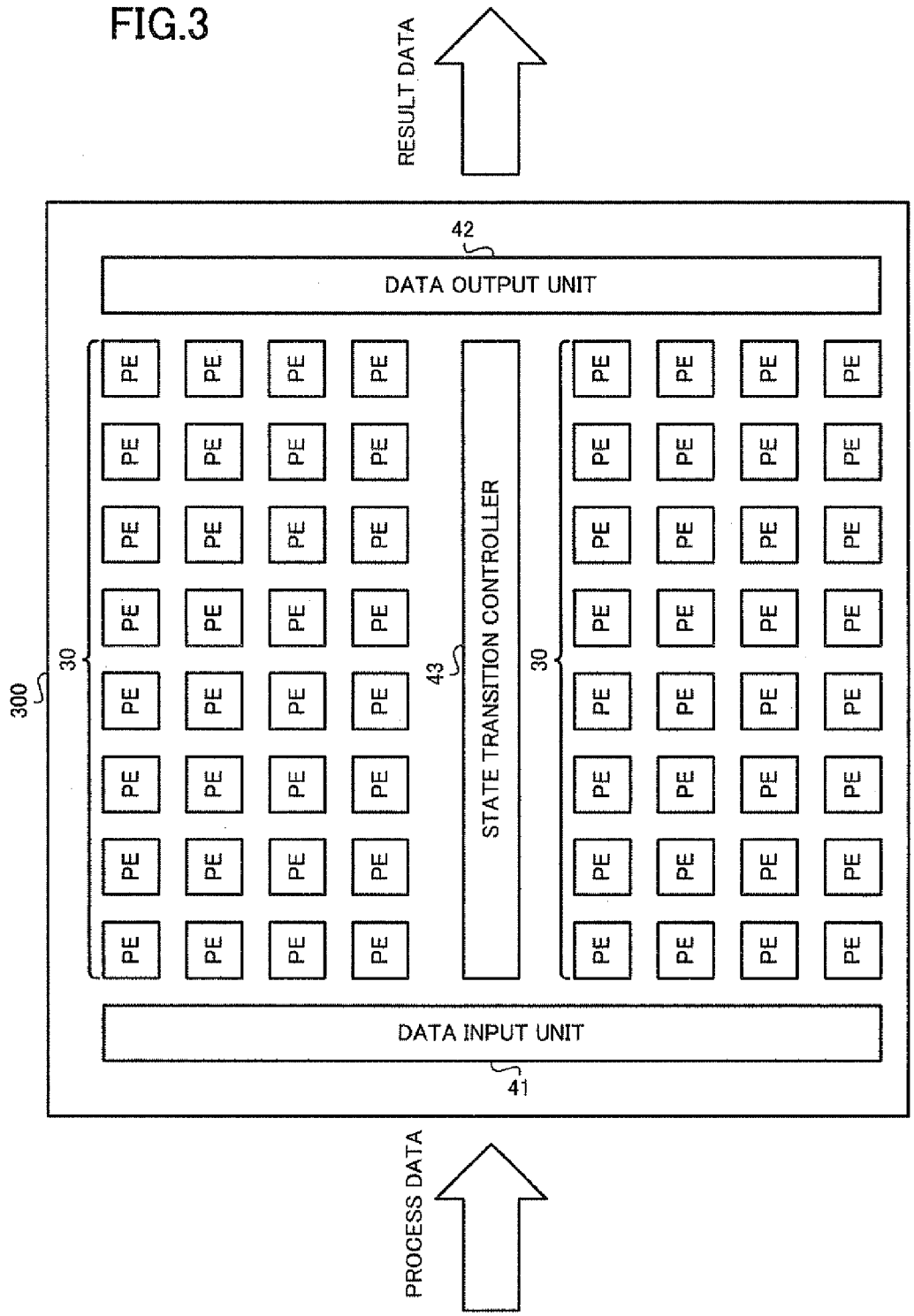
FIG. 3 is a diagram showing the schematic configuration of a DRP.

Next, referring to FIG. 3, a description will be given of a DRP (Dynamically Reconfigurable Processor) 300 which is an embodiment of a semiconductor integrated circuit realized by an RTL description generated by the behavioral synthesis apparatus 100.

The DRP 300 performs a predetermined computation on supplied process data, and outputs the computation result as result data. As shown in FIG. 3, the DRP 300 includes multiple PEs (Processing Elements) 30, a data input unit 41, a data output unit 42, and a state transition controller 43.

The PEs 30 are arranged in a lattice pattern in the DRP 300, and each PE 30 is connected to another PE 30 by a data wire and a flag wire. In the example shown in FIG. 3, 8×8=64 PEs 30 are disposed.

Figure 4:
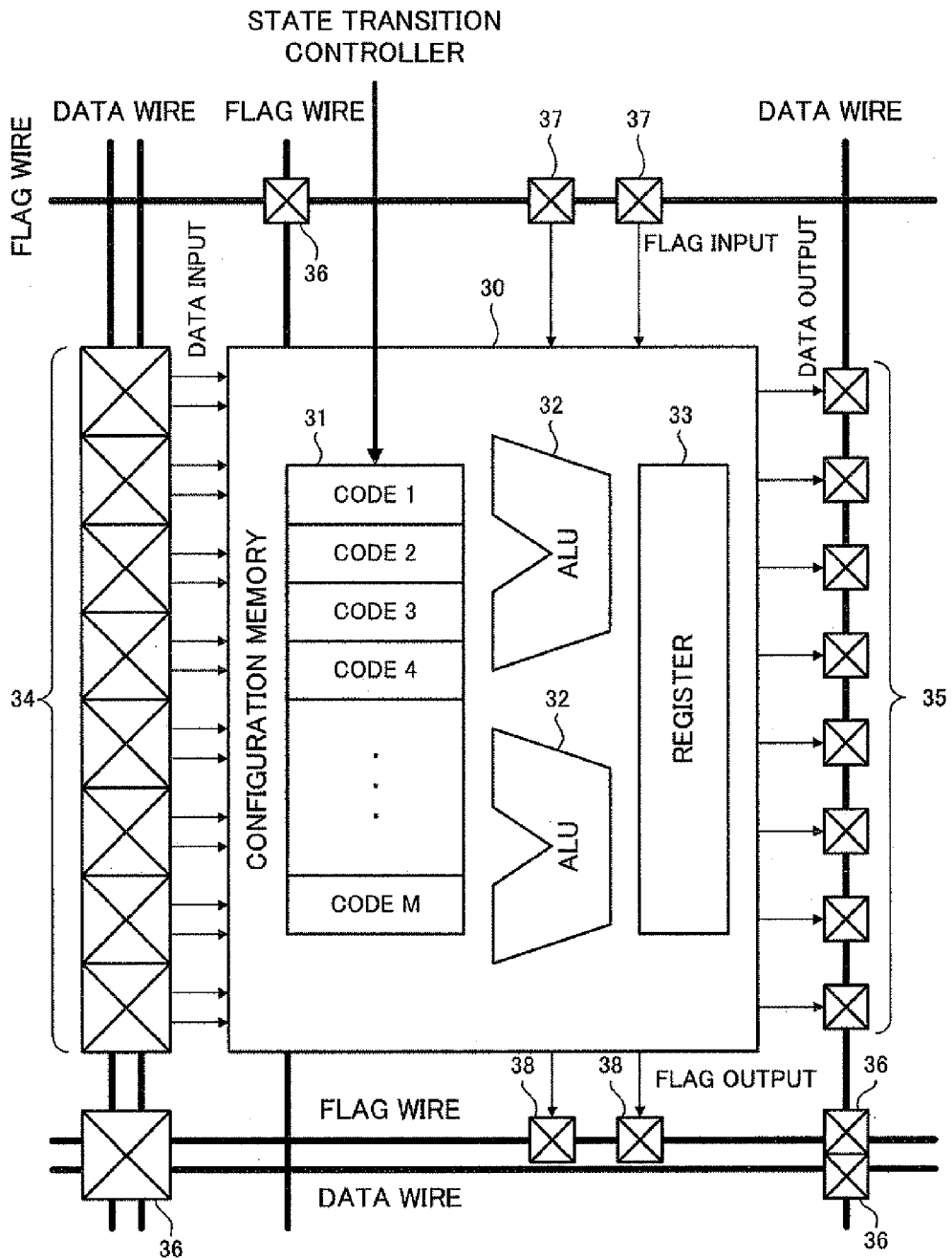
FIG. 4 is a diagram showing the schematic configuration of a PE.

As shown in FIG. 4, the PE 30 has a configuration memory 31, an ALU (Arithmetic Logic Unit) 32 and a register 33. Individual components of the PE 30 exchange data with one another, via a non-illustrated data wire, and exchange a flag with one another via a non-illustrated flag wire, within the PE30.

The PE 30 performs a predetermined computation on data supplied from another PE 30 via a data wire, and supplies data acquired by the computation to another PE 30 via the data wire. Moreover, the PE 30 receives a flag supplied from another PE 30 via a flag wire. Further, the PE 30 supplies a flag to another PE 30 via the flag wire.

The configuration memory 31 stores a configuration code (hereinafter, "circuit configuration information") comprised of an instruction content (hereinafter, "computation information") to the ALU 32, and wire connection information of wire connection switches 34 to 38.

The configuration memory 31 stores plural pieces of circuit configuration information each corresponding to a configuration face (hereinafter, "context") which is dynamically changed over a time axis. In the embodiment shown in FIG. 4, the configuration memory 31 stores plural pieces of circuit configuration information (code 1 to code M) corresponding to M contexts. A context is designated by the state transition controller 43 to be described later.

The ALU 32 performs computation on supplied data in accordance with computation information stored in the configuration memory 31. At this time, the ALU 32 uses computation information contained in circuit configuration information corresponding to a context designated by the state transition controller 43.

The register 33 temporarily stores computation-result data and intermediate data in computation both output by the ALU 32.

Each of the wire connection switches 34 to 36 connects, in accordance with wire connection information, a corresponding PE 30 (PE 30 having a configuration memory 31 storing the wire connection information) and another PE 30 (e.g., adjoining PE 30) together via a data wire.

Each of the wire connection switches 36 to 38 connects, in accordance wire connection information, a corresponding PE 30 (PE 30 having a configuration memory 31 storing the wire connection information) and another PE 30 (e.g., adjoining PE 30) together via a flag wire.

Each of the wire connection switches 34 to 38 connects a data wire or a flag wire in accordance with wire connection information contained in circuit configuration information which is stored in the configuration memory 31 and contained in circuit configuration information corresponding to a designated context. Note that the wire connection switch 36 is disposed at the intersection of a data wire or a flag wire.

Returning to FIG. 3, the data input unit 41 supplies process data supplied from outside the DRP 300 to the PEs 30.

The data output unit 42 outputs data supplied from the PE 30 as result data to outside the DRP 300.

The state transition controller 43 detects the state transition of a circuit based on the status of the input/output of each PE 30, a lock signal and the like. Based on the detected state transition, the state transition controller 43 detects at which timing and to which context the current context is to be changed over, and at which timing, which circuit part, is made active. The state transition controller 43 generates and outputs a signal indicative of the detection result.

Next, a behavioral synthesis process which is executed by the behavioral synthesis apparatus 100 will be described referring to a flowchart shown in FIG. 5. The following description is premised on that the behavioral synthesis apparatus 100 performs behavioral synthesis on behavioral level descriptions prestored in the hard disk 14 according to constraint conditions prestored in the hard disk 14 to generate an RTL description, and stores the RTL description in the hard disk 14. The behavioral level description to be explained hereinafter describes the behavior of the circuit (hereinafter referred too as "pipelined circuit") that efficiently processes data through a pipeline process.

Figure 5:
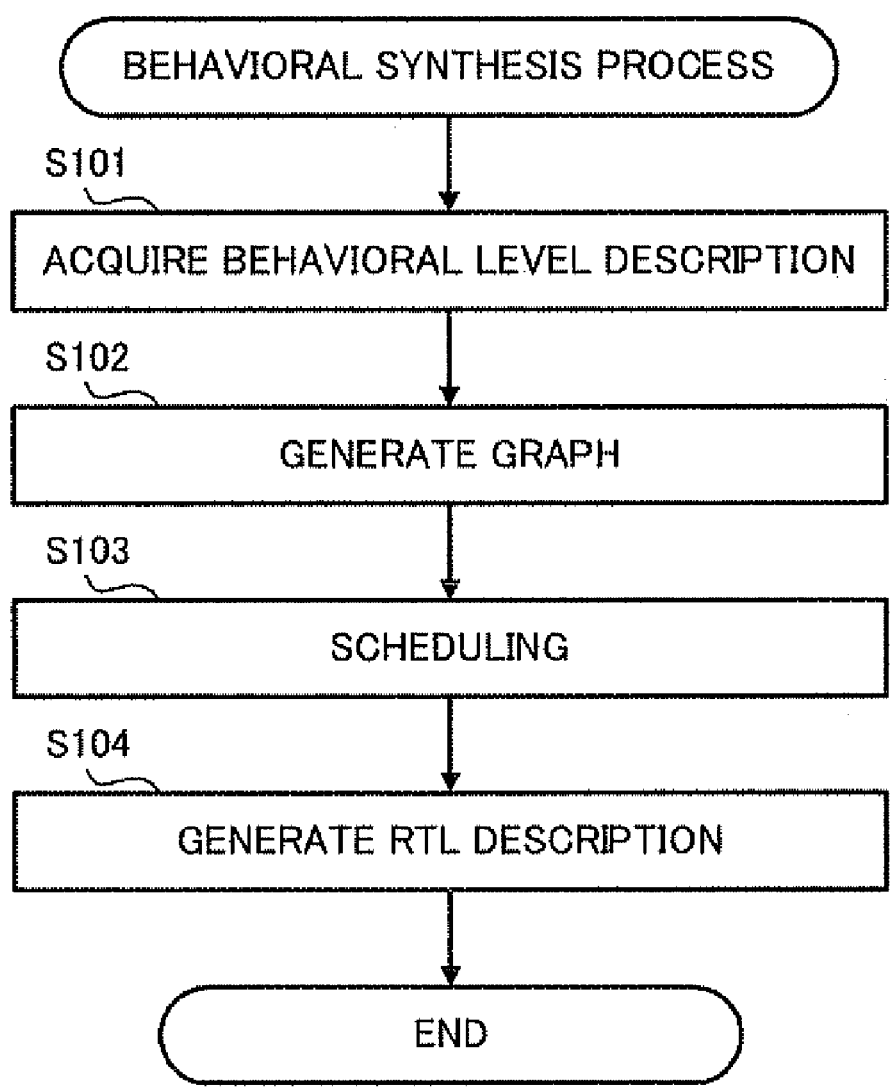
FIG. 5 is a flowchart illustrating procedures of a behavioral synthesis process which is executed by the behavioral synthesis apparatuses according to the first and second exemplary embodiments.

The behavioral synthesis apparatus 100, on receiving via the input device 15 designation of the behavioral level description of a behavioral synthesis target and a request to start behavioral synthesis from a user, starts the behavioral synthesis process illustrated in the flowchart in FIG. 5.

First, the CPU 11 acquires the behavioral level description of the behavioral synthesis target (step S101). Specifically, in response to reception of designation of the behavioral level description of the behavioral synthesis target at the input device 15 from the user, the CPU 11 reads the designated behavioral level description from the hard disk 14, and stores the behavioral level description into the RAM 13. That is, the CPU 11 and the input device 15 cooperate to serve as the acquisition unit 21.

Next, the CPU 11 generates a graph based on the behavioral level description (step S102). Specifically, the CPU 11 performs language analysis on a series of source codes indicated by the behavioral level description stored in the RAM 13 to generate a DFG (Data Flow Graph), and stores the generated DFG into the RAM 13.

Next, the CPU 11 makes a schedule based on the generated graph (step S103). Specifically, the CPU 11 schedules the DFG stored in the RAM 13 in consideration of the constraint conditions stored in the hard disk 14 to generate a CDFG (Control Data Flow Graph), and stores the generated CDFG into the RAM 13. That is, the CPU 11 serves as the scheduling unit 22.

Then, the CPU 11 generates an RTL description based on the scheduling result (step S104). Specifically, the CPU 11 generates an RTL description representing the state transition controller 43 and a pipelined circuit having plural stages of stage circuits based on the constraint conditions stored in the hard disk 14 and the CDFG stored in the RAM 13, and stores the generated RTL description into the hard disk 14. That is, the CPU 11 serves as the generation unit 23.

When the CPU 11 completes the generation of the RTL description, the behavioral synthesis apparatus 100 completes the behavioral synthesis process.

Figure 6:
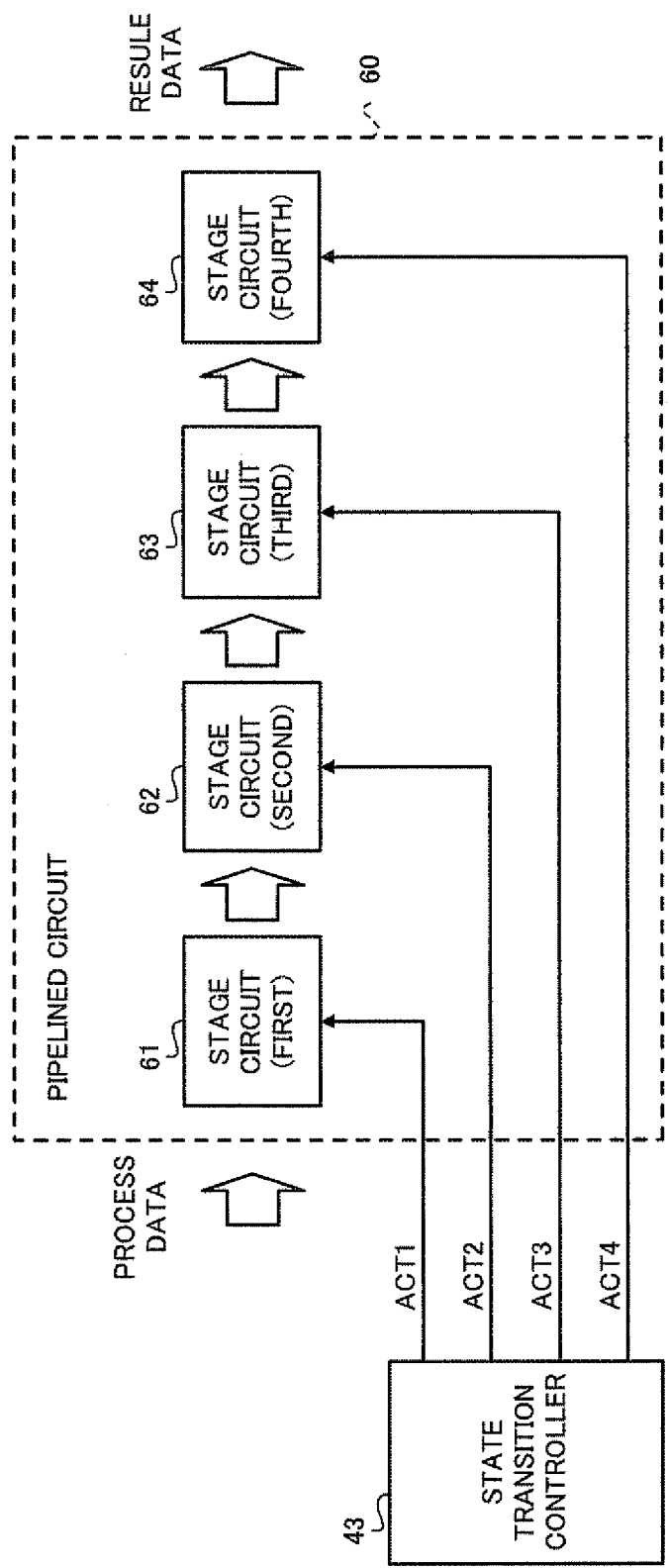
FIG. 6 is a diagram schematically showing how a state transition controller makes individual stage circuits active when a pipelined circuit is configured by a single context.
Figure 7:
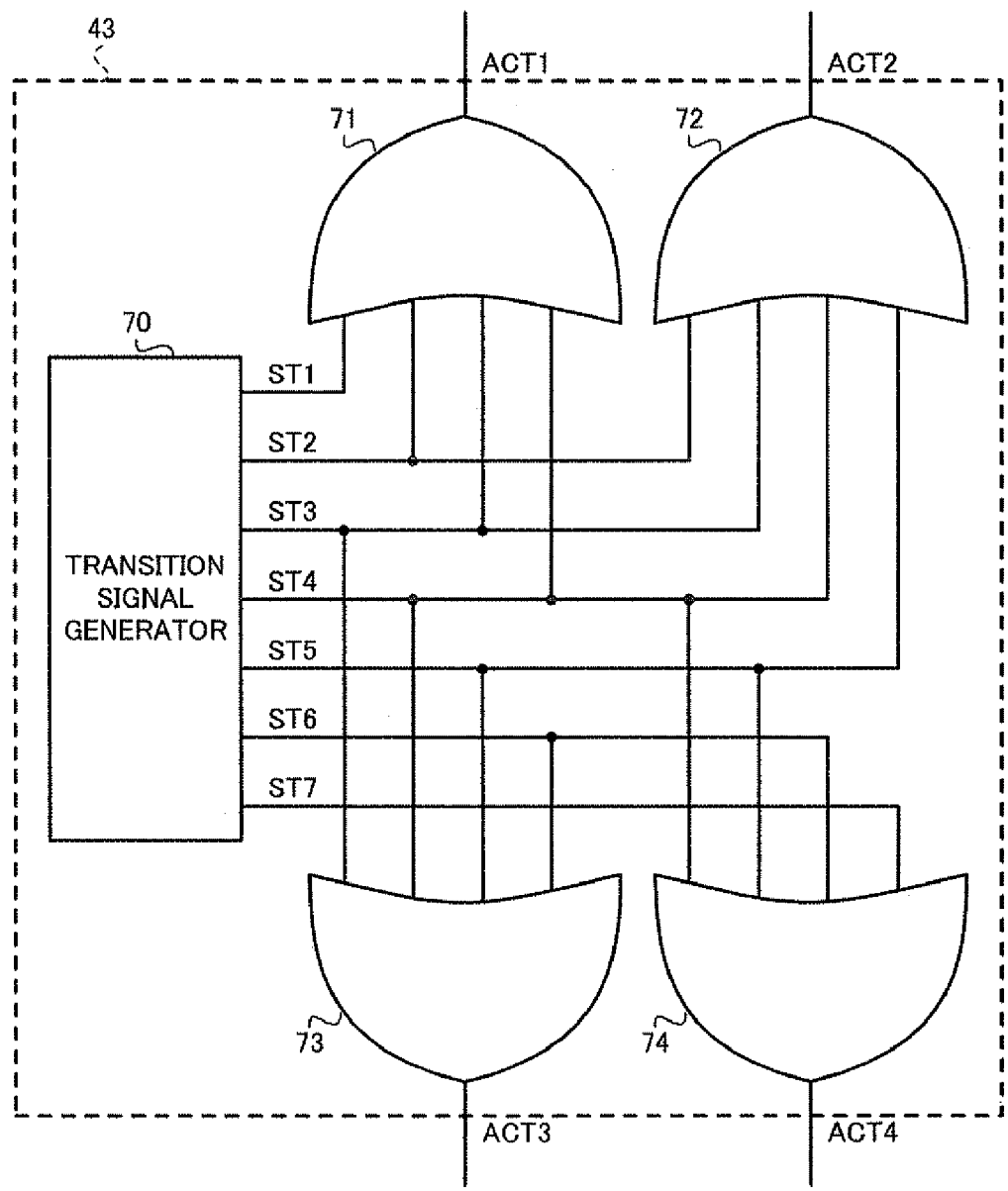
FIG. 7 is a diagram for explaining one example of a scheme by which the state transition controller generates an active signal when a pipelined circuit is configured by a single context.

Referring to FIGS. 6 to 8, a description will be given of a semiconductor integrated circuit which is realized by the RTL description generated by the behavioral synthesis apparatus 100 in the above-described manner. FIG. 6 is a diagram schematically showing how the state transition controller 43 makes stage circuits 61 to 64 constituting a pipelined circuit 60 active. FIG. 7 is a diagram for explaining one example of a scheme by which the state transition controller 43 generates a signal to make the stage circuits 61 to 64 active. FIG. 8 is a diagram schematically showing in what order the individual stage circuits 61 to 64 constituting the pipelined circuit 60 become active.

In the example shown in FIG. 6, the pipelined circuit 60 includes four (N=4) stage circuits, namely, a first stage circuit 61 which performs a computation on process data supplied to the pipelined circuit 60, and outputs data indicating the computation result, a second stage circuit 62 which performs a computation on the data supplied from the stage circuit 61, and outputs data indicating the computation result, a third stage circuit 63 which performs a computation on the data supplied from the stage circuit 62, and outputs data indicating the computation result, and a fourth stage circuit 64 which performs a computation on the data supplied from the stage circuit 63, and outputs data indicating the computation result.

The pipelined circuit 60 executes the pipeline process without changing over a context (configuration face). Therefore, the state transition controller 43 does not output a signal for changing over a context. For easier understanding, the following description will be given on the assumption that possible state transitions of a semiconductor integrated circuit correspond, in one-to-one, to possible stage control states of the pipelined circuit 60.

The state transition controller 43 supplies the pipelined circuit 60 with active signals ACT1 to ACT4 which are generated based on the possible 1 to 7 (2N−1=7) stage control states of the pipelined circuit 60 and which respectively make the stage circuits 61 to 64 active.

More specifically, the state transition controller 43 supplies the active signal ACT1 to the stage circuit 61 to make the stage circuit 61 active, supplies the active signal ACT2 to the stage circuit 62 to make the stage circuit 62 active, supplies the active signal ACT3 to the stage circuit 63 to make the stage circuit 63 active, and supplies the active signal ACT4 to the stage circuit 64 to make the stage circuit 64 active.

It is to be noted that the active signals ACT1 to ACT4, transition signals ST1 to ST7 to be described later, and context signals SC1, SC2 to be described later are electric signals having a signal level of either an H level or L level. For easier understanding, "the signal level is set to the H level" is expressed as "the signal is output (supplied)", and "the signal level is set to the L level" is expressed as "the signal is not output (supplied)" in the following description.

Next, referring to FIG. 7, one example of the scheme by which the state transition controller 43 generates the active signals ACT1 to ACT4. As shown in FIG. 7, the state transition controller 43 includes a transition signal generator 70, and OR gates 71 to 74.

The transition signal generator 70 generates and outputs the transition signals ST1 to ST7 each indicating in which state transition the semiconductor integrated circuit is. In this example, there are seven state transitions 1 to 7, so that there are seven stage control states 1 to 7. In the state transition 1, the transition signal generator 70 outputs the transition signal ST1 and outputs none of the other transition signals ST2 to ST7. Likewise, the transition signal generator 70 outputs only a transition signal corresponding to the state transition, and outputs none of the other transition signals.

The OR gates 71 to 74 generate and output the active signals ACT1 to ACT4 based on the transition signals ST1 to ST7.

More specifically, the OR gate 71 executes a logical operation to OR the transition signals ST1 to ST4, and outputs the operation result as the active signal ACT1.

The OR gate 72 executes a logical operation to OR the transition signals ST2 to ST5, and outputs the operation result as the active signal ACT2.

The OR gate 73 executes a logical operation to OR the transition signals ST3 to ST6, and outputs the operation result as the active signal ACT3.

The OR gate 74 executes a logical operation to OR the transition signals ST4 to ST7, and outputs the operation result as the active signal ACT4.

In this manner, the state transition controller 43 generates and outputs the active signal ACT1, ACT2, ACT3, ACT4 based on the stage control state (because stage control states correspond to state transitions in one-to-one in the exemplary embodiment, a stage control state is the same as a state transition).

In FIG. 6, each of the stage circuits 61 to 64 becomes active while the active signal is supplied from the state transition controller 43, and does not become active while the active signal is not supplied therefrom.

In other words, the stage circuit 61 is configured in such a way that the stage circuit 61 performs a predetermined computation on process data supplied from outside the pipelined circuit 60, and outputs data indicating the computation result to the stage circuit 62 while the stage circuit 61 is active, and does not output data (or outputs a predetermined value) to the stage circuit 62 while the stage circuit 61 is not active.

The stage circuit 62 is configured in such a way that the stage circuit 62 performs a predetermined computation on process data supplied from the stage circuit 61, and outputs data indicating the computation result to the stage circuit 63 while the stage circuit 62 is active, and does not output data (or outputs a predetermined value) to the stage circuit 63 while the stage circuit 62 is not active. The stage circuit 63 is configured in such a way that the stage circuit 63 performs a predetermined computation on process data supplied from the stage circuit 62, and outputs data indicating the computation result to the stage circuit 64 while the stage circuit 63 is active, and does not output data (or outputs a predetermined value) to the stage circuit 64 while the stage circuit 63 is not active. The stage circuit 64 is configured in such a way that the stage circuit 64 performs a predetermined computation on process data supplied from the stage circuit 63, and outputs data indicating the computation result to outside the pipelined circuit 60 as result data while the stage circuit 64 is active, and does not output data (or outputs a predetermined value) to outside the pipelined circuit 60 while the stage circuit 64 is not active.

Referring to FIG. 8, a description will be given of in what order the individual stage circuits 61 to 64 become active. FIG. 8 shows an active stage circuit in a square.

The pipelined circuit 60 carries out the pipeline process by repeatedly executing stage processes in the respective stage circuits 61 to 64. In the transient state where the process at the start of the pipeline process (prologue process) and the process at the end of the pipeline process (epilogue process) are executed, therefore, there exists a stage circuit which need not be set active (or a stage circuit, if set active, may cause a problem, such as malfunction).

In the transient state, therefore, it is required to carry out the control that inhibits the stage circuit which need not be operated from becoming active.

In the example shown in FIG. 8, the stage circuit 61 is set active during the stage control state 1, the stage circuits 61, 62 are set active during the stage control state 2, the stage circuits 61, 62, 63 are set active during the stage control state 3, all the stage circuits 61 to 64 are set active during the stage control state 4, the stage circuits 62, 63, 64 are set active during the stage control state 5, the stage circuits 63, 64 are set active during the stage control state 6, and the stage circuit 64 is set active during the stage control state 7.

That is, in the prologue process (stage control states 1 to 3) and the epilogue process (stage control states 5 to 7), some of the stage circuits are not set active. In the steady state (stage control state 4), all the stage circuits are set active.

In the semiconductor integrated circuit realized by an RTL description generated by the behavioral synthesis apparatus 100, as described above, the state transition controller 43 controls the pipelined circuit 60 in such a way that a circuit part which needs not be operated does not become active.

It can therefore be expected to reduce malfunctions which may be originated from supply of improper data to a circuit part which processes the next step.

Based on the detected state transition, the state transition controller 43 determines whether or not to set each circuit part active. This makes it possible to realize a pipelined circuit which does not need a circuit to set each circuit part active/non-active.

In the past, it is difficult to compute circuit delays and circuit scales in adding those extra circuits, thus requiring that a large margin should be provided in the design. However, the present invention does not need such extra circuits, thus making it possible to compute circuit delays and circuit scales more accurately.

Therefore, it is expected to make the circuit scale compact and improve the processing speed in the steady state (state equivalent to the portion enclosed by the broken line in FIG. 8).

Second Exemplary Embodiment

The foregoing description of the first exemplary embodiment has illustrated the example that executes a pipeline process without changing over the context. However, in a case where there is a large amount of data to be processed in parallel in the pipeline process, for example, the individual stage circuits may not be fitted in a single context. In this case, the pipelined circuit is configured to execute the pipeline process while changing over a plurality of contexts from one to another.

A behavioral synthesis apparatus 100 according to the second exemplary embodiment will be described referring to the accompanying drawings. As the configuration of the behavioral synthesis apparatus 100 according to this exemplary embodiment is the same as the configuration of the behavioral synthesis apparatus 100 according to the first exemplary embodiment, its description will be omitted.

Figure 9:
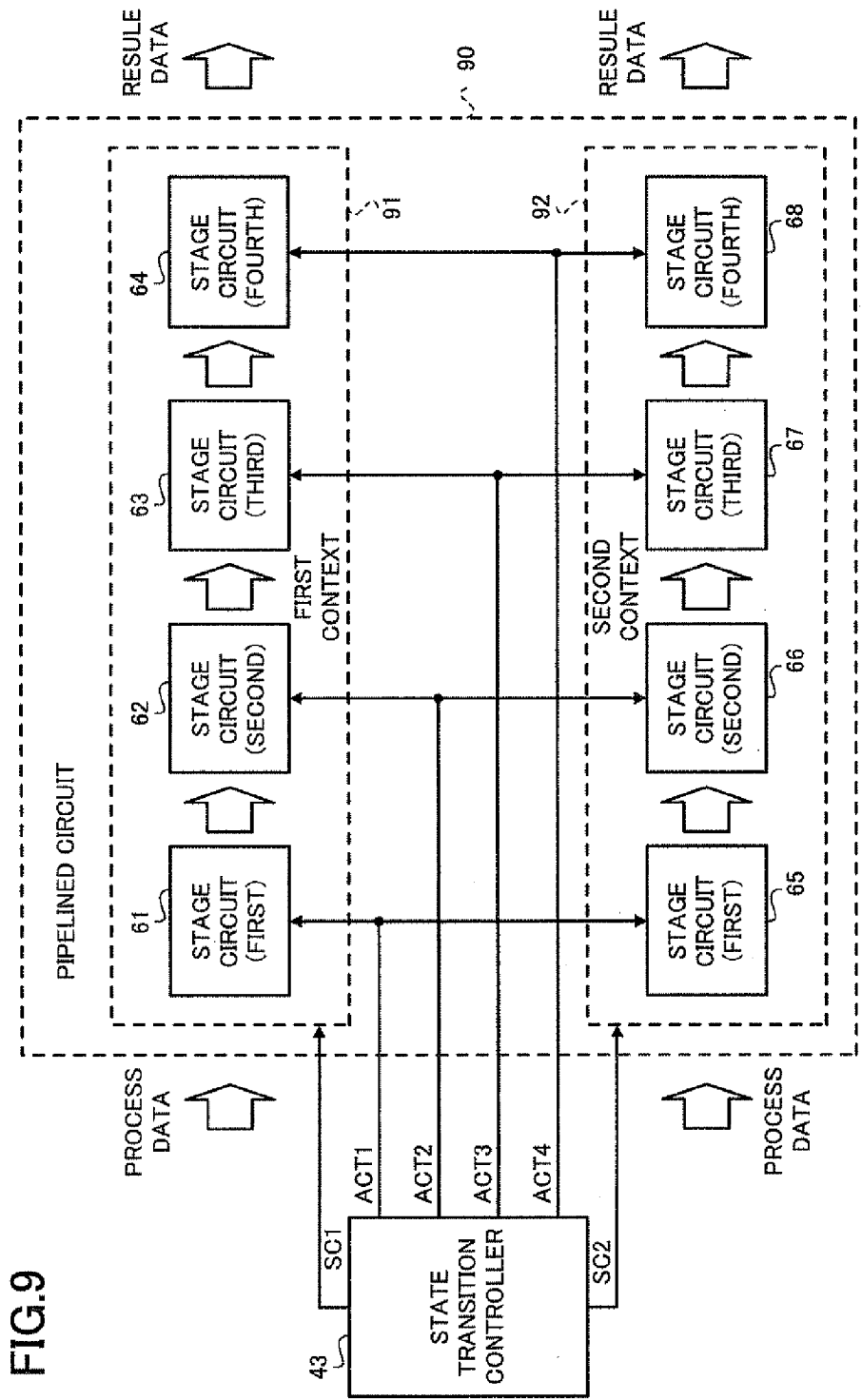
FIG. 9 is a diagram schematically showing how the state transition controller makes individual stage circuits active when a pipelined circuit is configured by two contexts.

FIG. 9 is a diagram schematically showing how the state transition controller 43 makes individual stage circuits 61 to 68 constituting a pipelined circuit 90 active.

In the example shown in FIG. 9, the pipelined circuit 90 logically includes two contexts (M=2), namely, a first context 91 which executes a first pipeline process, and a second context 92 which executes a second pipeline process.

The first context 91 includes four (N=4) stage circuits, namely, a first stage circuit 61 which performs a computation on process data supplied to the pipelined circuit 90, and outputs data indicating the computation result, a second stage circuit 62 which performs a computation on the data supplied from the stage circuit 61, and outputs data indicating the computation result, a third stage circuit 63 which performs a computation on the data supplied from the stage circuit 62, and outputs data indicating the computation result, and a fourth stage circuit 64 which performs a computation on the data supplied from the stage circuit 63, and outputs data indicating the computation result.

The second context 92 includes four (N=4) stage circuits, namely, a first stage circuit 65 which performs a computation on process data supplied to the pipelined circuit 90, and outputs data indicating the computation result, a second stage circuit 66 which performs a computation on the data supplied from the stage circuit 65, and outputs data indicating the computation result, a third stage circuit 67 which performs a computation on the data supplied from the stage circuit 66, and outputs data indicating the computation result, and a fourth stage circuit 68 which performs a computation on the data supplied from the stage circuit 67, and outputs data indicating the computation result.

The state transition controller 43 supplies the pipelined circuit 90 with active signals ACT1 to ACT4 which are generated based on the possible 1 to 7 (2N−1=7) stage control states of the pipelined circuit 90 and which respectively make the stage circuits 61 to 68 active.

More specifically, the state transition controller 43 supplies the active signal ACT1 to the stage circuits 61, 65 to make the stage circuits 61, 65 active, supplies the active signal ACT2 to the stage circuits 62, 66 to make the stage circuits 62, 66 active, supplies the active signal ACT3 to the stage circuits 63, 67 to make the stage circuits 63, 67 active, and supplies the active signal ACT4 to the stage circuits 64, 68 to make the stage circuits 64, 68 active.

The pipelined circuit 90 executes the pipeline process while changing over contexts from one to another. Therefore, the state transition controller 43 supplies one of a context signal SC1 to set the first context 91 active and a context signal SC2 to set the second context 92 active to the pipelined circuit 90.

More specifically, the state transition controller 43 supplies the context signal SC1 to the first context 91 in executing the first pipeline process, and supplies the context signal SC2 to the second context 92 in executing the second pipeline process.

Figure 10:
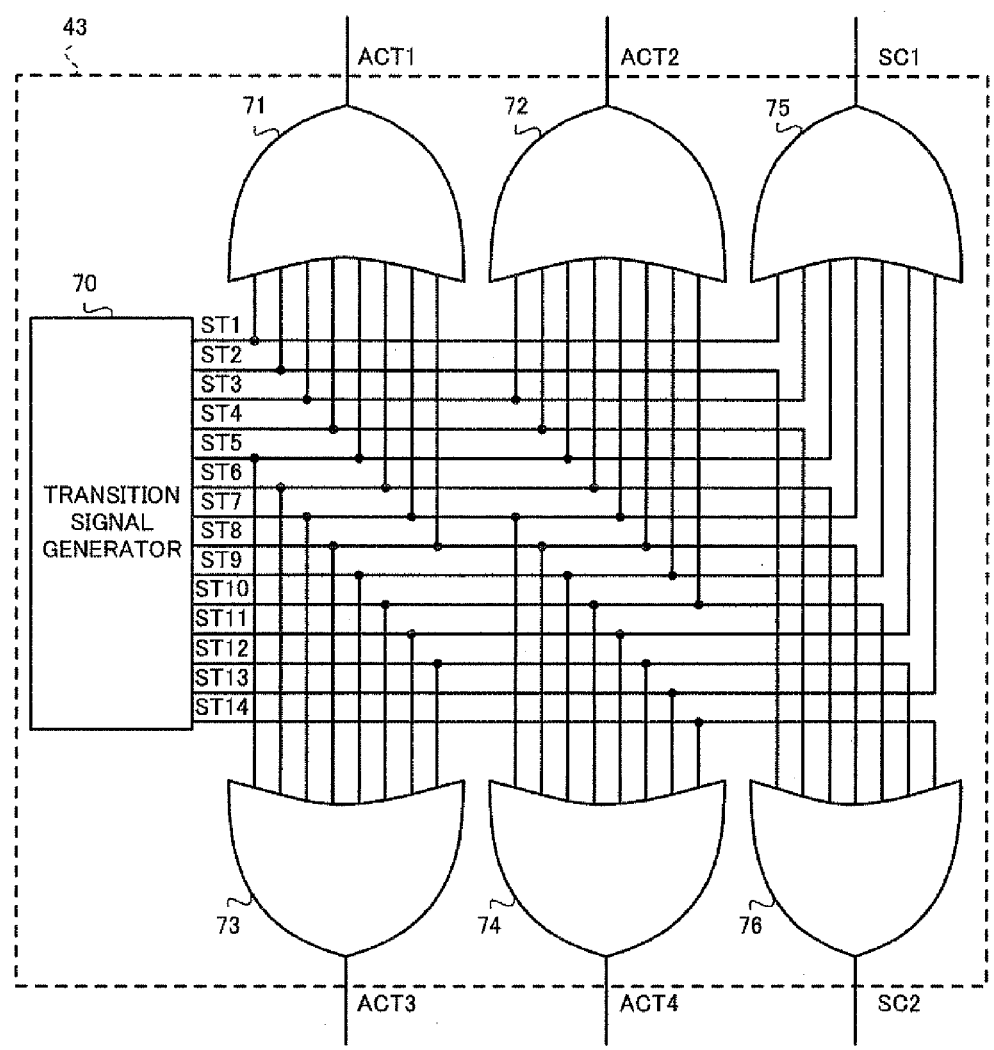
FIG. 10 is a diagram for explaining one example of a scheme by which the state transition controller generates an active signal and a context signal when a pipelined circuit is configured by two contexts.

Referring now to FIG. 10, one example of the scheme by which the state transition controller 43 generates the active signals ACT1 to ACT4 and the context signals SC1, SC2. As shown in FIG. 10, the state transition controller 43 includes a transition signal generator 70, and OR gates 71 to 76.

The transition signal generator 70 generates and outputs the transition signals ST1 to ST14 each indicating in which state transition the semiconductor integrated circuit is. In this example, it is assumed that there are fourteen state transitions 1 to 14. As there are two contexts, two state transitions correspond to one stage control state. Therefore, there are seven stage control states 1 to 7. The transition signal generator 70 outputs only a transition signal corresponding to the state transition, and outputs none of the other transition signals, as per the first exemplary embodiment.

The OR gates 71 to 74 generate and output the active signals ACT1 to ACT4 based on the transition signals ST1 to ST14. More specifically, the OR gate 71 executes a logical operation to OR the transition signals ST1 to ST8, and outputs the operation result as the active signal ACT1.

The OR gate 72 executes a logical operation to OR the transition signals ST3 to ST10, and outputs the operation result as the active signal ACT2.

The OR gate 73 executes a logical operation to OR the transition signals ST5 to ST12, and outputs the operation result as the active signal ACT3.

The OR gate 74 executes a logical operation to OR the transition signals ST7 to ST14, and outputs the operation result as the active signal ACT4.

In this manner, the state transition controller 43 generates and outputs the active signal ACT1, ACT2, ACT3, ACT4 based on each stage control state which corresponds to two state transitions.

The OR gates 75 and 76 generate and output the context signals SC1, SC2 based on the transition signals ST1 to ST14. More specifically, the OR gate 75 executes a logical operation to OR the transition signals ST1, ST3, ST5, ST7, ST9, ST11 and ST13, and outputs the operation result as the context signal SC1.

The OR gate 76 executes a logical operation to OR the transition signals ST2, ST4, ST6, ST8, ST10, ST12 and ST14, and outputs the operation result as the context signal SC2.

In FIG. 9, the first context 91 becomes active while the context signal SC1 is supplied, and the second context 92 becomes active while the context signal SC2 is supplied.

Therefore, each of the stage circuits 61 to 68 becomes active while the context signal is supplied to the corresponding context and the active signal is supplied to the local stage circuit, but does not become active while the context signal is not supplied to the corresponding context or the active signal is not supplied to the local stage circuit.

FIG. 11 is a diagram schematically showing in what order the individual stage circuits 61 to 68 constituting the pipelined circuit 90 are set active.

In the example shown in FIG. 11, the stage circuits 61, 65 are set active in the stage control state 1, the stage circuits 61, 62, 65, 66 are set active in the stage control state 2, the stage circuits 61, 62, 63, 65, 66, 67 are set active in the stage control state 3, and all of the stage circuits 61 to 68 are set active in the stage control state 4.

The stage circuits 62, 63, 64, 66, 67, 68 are set active in the stage control state 5, the stage circuits 63, 64, 67, 68 are set active in the stage control state 6, and the stage circuits 64, 68 are set active in the stage control state 7.

That is, in the prologue process (stage control states 1 to 3) and the epilogue process (stage control states 5 to 7), some of the stage circuits are not set active. In the steady state (stage control state 4), all the stage circuits are set active.

Figure 12:
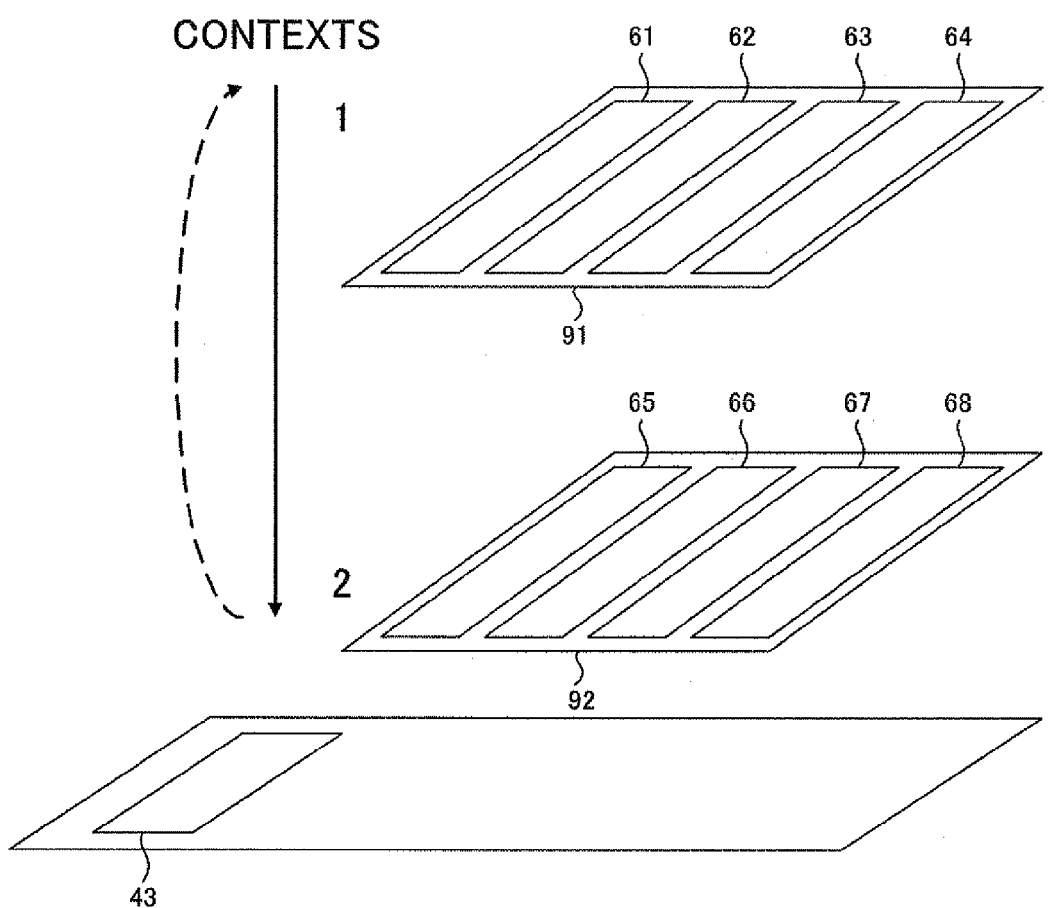
FIG. 12 is a diagram schematically showing how the state transition controller changes over two contexts from one to the other.

As shown in FIG. 12, the state transition controller 43 performs a changeover according to the detected state transitions, between the two contexts, namely, the first context 91 which executes the first pipeline process, and the second context 92 which executes the second pipeline process, from one to the other.

In this case, each stage circuit becomes active when the corresponding context is set active and the active signal is supplied to the local stage circuit. In other words, each stage circuit does not become active when the corresponding context is not set active even if the active signal is supplied to the local stage circuit.

As described above, the behavioral synthesis apparatus 100 according to the exemplary embodiment can realize the pipelined circuit which executes a plurality of pipeline processes substantially in parallel while changing over the contexts from one to another without adding extra circuits.

The above embodiments have shown DRP based configuration of the pipelined circuit, which can, of course, be realized by other kind of reconfigurable electronic circuit, such as an FPGA (Field Programmable Gate Array).

In the foregoing descriptions of the exemplary embodiments, the state transition controller 43 generates active signals using the transition signal generator which generates transition signals, and OR gates. However, the exemplary embodiments are just illustrative and not limited to the scheme of allowing the state transition controller 43 to generate the active signals.

In addition, adapting the program may allow an existing personal computer (PC) or the like to serve as the behavioral synthesis apparatus according to the invention. That is, as the program which is executed by the CPU 11 is installed on an existing PC or the like and the CPU or so of the PC or the like runs the program, the PC or the like can be allowed to serve as the behavioral synthesis apparatus according to the invention.

The distribution method for such a program is optional; for example, the program may be stored in a computer readable recording medium, such as CD-ROM (Compact Disk Read-Only Memory), DVD (Digital Versatile Disk), MO (Magneto Optical Disk), or a memory card, to be distributed, or may be distributed over a communication network like the Internet, As described above, the invention can provide a behavioral synthesis apparatus and behavioral synthesis method, which are suitable for generating an RTL description to achieve a fast pipelined circuit, and a computer readable recording medium recording a program suitable for generating such a RTL description.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

What is claimed is:

1. A behavioral synthesis apparatus comprising:
    a acquisition unit configured to acquire a behavioral level description describing an operation of a semiconductor integrated circuit;
    a scheduling unit configured to separate the acquired behavioral level description into N stage descriptions, and schedule input/output operations and computations among the N stage descriptions; and
    a generation unit configured to generate a register transfer level description describing a configuration, layout and interconnection of the semiconductor integrated circuit based on the N stage descriptions and a result of scheduling performed by the scheduling unit to form stage circuits respectively corresponding to the N stage descriptions and a state control circuit which controls possible 2N−1 stage control states of the semiconductor integrated circuit, the generation unit generating the register transfer level description,
    wherein for each integer i=1, 2, . . . , N−1, an output of an ith stage circuit becomes an input to an (i+1)th stage circuit, and
    wherein the state control circuit updates the stage control states of the semiconductor integrated circuit in order from a first stage control state to an (N−1)th stage control state, then repeats an Nth stage control state a predetermined number of times, then updates the stage control states of the semiconductor integrated circuit in order from an (N+1)th stage control state to an (2N−1)th stage control state, and
    wherein when a current stage control state is a jth stage control state, the state control circuit:
    (a) operates the first to jth stage circuits and stops (j+1)th to Nth stage circuits when j is an integer equal to or greater than 1 and less than N,
    (b) operates the first to Nth stage circuits when j is equal to N, and
    (c) stops the first to (j−N)th stage circuits and operates (j−N+1)th to Nth stage circuits when j is greater than N.

2. The behavioral synthesis apparatus according to claim 1, wherein the generation unit is configured to generate the register transfer level description,
    wherein
    each of the 2N−1 stage control states is separated into M operational states, and
    wherein when a current operational state is a kth operational state, the state control circuit changes the configuration, layout and interconnection of the semiconductor integrated circuit to a kth context.

3. A behavioral synthesis apparatus comprising:
    acquisition means configured to acquire a behavioral level description describing an operation of a semiconductor integrated circuit;
    scheduling means configured to separate the acquired behavioral level description into N stage descriptions, and schedule input/output operations and computations among the N stage descriptions; and
    generation means configured to generate a register transfer level description describing a configuration, layout and interconnection of the semiconductor integrated circuit based on the N stage descriptions and a result of scheduling performed by the scheduling means to form stage circuits respectively corresponding to the N stage descriptions and a state control circuit which controls possible 2N−1 stage control states of the semiconductor integrated circuit, the generation means generating the register transfer level description, wherein for each integer i=1, 2, . . . , N−1, an output of an ith stage circuit becomes an input to an (i+1)th stage circuit, and wherein the state control circuit updates the stage control states of the semiconductor integrated circuit in order from a first stage control state to an (N−1)th stage control state, then repeats an Nth stage control state a predetermined number of times, then updates the stage control states of the semiconductor integrated circuit in order from an (N+1)th stage control state to an (2N−1)th stage control state, and wherein when a current stage control state is a jth stage control state, the state control circuit:

(a) operates the first to jth stage circuits and stops (j+1)th to Nth stage circuits when j is an integer equal to or greater than 1 and less than N, (b) operates the first to Nth stage circuits when j is equal to N, and (c) stops the first to (j−N)th stage circuits and operates (j−N+1)th to Nth stage circuits when j is greater than N.

4. The behavioral synthesis apparatus according to claim 3, wherein the generation means is configured to generate the register transfer level description, wherein each of the 2N−1 stage control states is separated into M operational states, and wherein when a current operational state is a kth operational state, the state control circuit changes the configuration, layout and interconnection of the semiconductor integrated circuit to a kth context.

5. A behavioral synthesis method to be executed by a behavioral synthesis apparatus including an acquisition unit, a scheduling unit and a generation unit, comprising:

an acquisition step of causing the acquisition unit to acquire a behavioral level description describing an operation of a semiconductor integrated circuit;

a scheduling step of causing the scheduling unit to separate the acquired behavioral level description into N stage descriptions, and schedule input/output operations and computations among the N stage descriptions; and a generation step of causing the generation unit to generate a register transfer level description describing a configuration, layout and interconnection of the semiconductor integrated circuit based on the N stage descriptions and a result of scheduling performed by the scheduling unit to form stage circuits respectively corresponding to the N stage descriptions and a state control circuit which controls possible 2N−1 stage control states of the semiconductor integrated circuit, the generation unit generating the register transfer level description, wherein for each integer i=1, 2, . . . , N−1, an output of an ith stage circuit becomes an input to an (i+1)th stage circuit, and wherein the state control circuit updates the stage control states of the semiconductor integrated circuit in order from a first stage control state to an (N−1)th stage control state, then repeats an Nth stage control state a predetermined number of times, then updates the stage control states of the semiconductor integrated circuit in order from an (N+1)th stage control state to an (2N−1)th stage control state, and when a current stage control state is a jth stage control state, the state control circuit:

(a) operates the first to jth stage circuits and stops (j+1)th to Nth stage circuits when j is an integer equal to or greater than 1 and less than N, (b) operates the first to Nth stage circuits when j is equal to N, and (c) stops the first to (j−N)th stage circuits and operates (j−N+1)th to Nth stage circuits when j is greater than N.

6. The behavioral synthesis method according to claim 5, wherein the generation unit generates the register transfer level description, wherein each of the 2N−1 stage control states is separated into M operational states, and wherein when a current operational state is a kth operational state, the state control circuit changes the configuration, layout and interconnection of the semiconductor integrated circuit to a kth context.

7. A computer readable recording device recording a program allowing a computer to function as:

an acquisition unit configured to acquire a behavioral level description describing an operation of a semiconductor integrated circuit;

a scheduling unit configured to separate the acquired behavioral level description into N stage descriptions, and schedule input/output operations and computations among the N stage descriptions; and a generation unit configured to generate a register transfer level description describing a configuration, layout and interconnection of the semiconductor integrated circuit based on the N stage descriptions and a result of scheduling performed by the scheduling unit in such a way as to form stage circuits respectively corresponding to the N stage descriptions and a state control circuit which controls possible 2N−1 stage control states of the semiconductor integrated circuit, the generation unit generating the register transfer level description, wherein for each integer i=1, 2, . . . , N−1, an output of an ith stage circuit becomes an input to an (i+1)th stage circuit, and wherein the state control circuit updates the stage control states of the semiconductor integrated circuit in order from a first stage control state to an (N−1)th stage control state, then repeats an Nth stage control states a predetermined number of times, then updates the stage control states of the semiconductor integrated circuit in order from an (N+1)th stage control state to an (2N−1)th stage control state, and wherein when a current stage control state is a jth stage control state, the state control circuit:

(a) operates the first to jth stage circuits and stops (j+1)th to Nth stage circuits when j is an integer equal to or greater than 1 and less than N, (b) operates the first to Nth stage circuits when j is equal to N, and (c) stops the first to (j−N)th stage circuits and operates (j−N+1)th to Nth stage circuits when j is greater than N.

* * * * *